United States Patent
Kang et al.

(10) Patent No.: US 12,463,074 B2
(45) Date of Patent: Nov. 4, 2025

(54) SUBSTRATE TRANSFER SYSTEM AND METHOD WITH CHARGING FUNCTION

(71) Applicant: Samsung Electronics Co., Ltd., Suwon-si (KR)

(72) Inventors: Seunggyu Kang, Hwaseong-si (KR); Jeonghun Lim, Suwon-si (KR); Youngwook Kim, Seoul (KR); Chuljun Park, Seoul (KR); Yongjun Ahn, Suwon-si (KR); Sangkyung Lee, Hwaseong-si (KR); Hyunwoo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 442 days.

(21) Appl. No.: 17/946,727

(22) Filed: Sep. 16, 2022

(65) Prior Publication Data
US 2023/0253227 A1     Aug. 10, 2023

(30) Foreign Application Priority Data
Feb. 7, 2022     (KR) .................. 10-2022-0015764

(51) Int. Cl.
*H01L 21/677* (2006.01)
*H01L 21/67* (2006.01)
(Continued)

(52) U.S. Cl.
CPC .. *H01L 21/67742* (2013.01); *H01L 21/67259* (2013.01); *H01L 21/67294* (2013.01);
(Continued)

(58) Field of Classification Search
CPC .... B25J 11/0095; B25J 19/0045; B25J 19/02; H01L 21/67742; H01L 21/67259;
(Continued)

(56) References Cited

U.S. PATENT DOCUMENTS 9,582,950 B2 *  2/2017  Shimizu .................. G07C 9/28
9,908,425 B2    3/2018  Prokhorov
(Continued)

FOREIGN PATENT DOCUMENTS

JP    5995845 B2     9/2016
JP    2017085699 A   5/2017
(Continued)

OTHER PUBLICATIONS

KR-101445911-B1 translation (Year: 2014).*
KR-20070069494-A translation (Year: 2007).*
KR-20150113079-A translation (Year: 2015).*

*Primary Examiner* — Kyle T Johnson
(74) *Attorney, Agent, or Firm* — Muir Patent Law, PLLC

(57) ABSTRACT

A substrate transfer system and method includes a mobile robot configured to handle a substrate carrier and comprising a power receiver; a mobile robot interface device configured to handle the substrate carrier and comprising a power feeder configured to supply an electromotive force to the power receiver of the mobile robot; at least one of: a first actuator configured to move the power feeder to adjust a distance between the power feeder and the power receiver and a second actuator configured to move the power receiver to adjust a distance between the power feeder and the power receiver; an identification tag disposed on any one of the mobile robot and the mobile robot interface device; a tag reader configured to recognize the identification tag; and a controller configured to control an operation of the mobile robot and to control an operation of the first and/or second actuator and the controller is further configured to control the first and/or second actuator to adjust the distance between the power feeder and the power receiver.

20 Claims, 14 Drawing Sheets

(51) Int. Cl.
*H02J 50/12* (2016.01)
*H02J 50/90* (2016.01)
*H01M 10/48* (2006.01)

(52) U.S. Cl.
CPC .... *H01L 21/6773* (2013.01); *H01L 21/67736* (2013.01); *H02J 50/12* (2016.02); *H02J 50/90* (2016.02); *H01M 10/486* (2013.01)

(58) Field of Classification Search
CPC ........... H01L 21/67294; H01L 21/6773; H01L 21/67736; H02J 50/12; H02J 50/90; H02J 50/10; H01M 10/486
See application file for complete search history.

(56) References Cited

U.S. PATENT DOCUMENTS

| | | | |
|---|---|---|---|
| 10,199,874 B2* | 2/2019 | Kaechi | H02J 50/90 |
| 11,312,257 B2 | 4/2022 | Lee et al. | |
| 2001/0048871 A1* | 12/2001 | Sasaki | H01L 21/67736 |
| | | | 414/539 |
| 2006/0245850 A1* | 11/2006 | Hashimoto | H01L 21/67778 |
| | | | 414/217 |
| 2012/0012101 A1 | 1/2012 | Trujillo et al. | |
| 2015/0185310 A1* | 7/2015 | Chang | H01L 21/68 |
| | | | 342/464 |
| 2016/0133502 A1* | 5/2016 | Won | B25J 9/1679 |
| | | | 901/46 |
| 2017/0173796 A1* | 6/2017 | Kim | B25J 9/1612 |
| 2017/0355275 A1* | 12/2017 | Kwasnick | H02J 50/10 |
| 2018/0115196 A1* | 4/2018 | Kanno | H02J 50/10 |
| 2020/0083080 A1* | 3/2020 | Clark | H01L 21/76834 |
| 2020/0090949 A1* | 3/2020 | Ueno | H01L 21/67294 |
| 2023/0253227 A1* | 8/2023 | Kang | H02J 50/12 |
| | | | 414/222.01 |
| 2024/0278991 A1* | 8/2024 | Sadeghi | G06K 7/1417 |

FOREIGN PATENT DOCUMENTS

| | | | | | |
|---|---|---|---|---|---|
| KR | 10-2007-0069494 A | | 7/2007 | | |
| KR | 20070069494 A | * | 7/2007 | | |
| KR | 10-2014-0014424 A | | 2/2014 | | |
| KR | 101445911 B1 | * | 9/2014 | | |
| KR | 20150113079 A | * | 10/2015 | ........... | H01L 21/681 |
| KR | 10-2017-0073798 A | | 6/2017 | | |
| KR | 10-1951092 B1 | | 2/2019 | | |
| KR | 10-2020-0037548 A | | 4/2020 | | |

* cited by examiner

SUBSTRATE TRANSFER SYSTEM AND METHOD WITH CHARGING FUNCTION

CROSS-REFERENCE TO RELATED APPLICATION

This application is based on and claims priority under 35 U.S.C. § 119 to Korean Patent Application No. 10-2022-0015764, filed on Feb. 7, 2022, in the Korean Intellectual Property Office, the disclosure of which is incorporated by reference herein in its entirety.

BACKGROUND

The present disclosure relates to a substrate transfer system and method, and more particularly, to a substrate transfer system and method capable of increasing a substrate carrier transfer efficiency between semiconductor facilities.

During a semiconductor manufacturing process, a substrate carrier may be transferred between semiconductor facilities via a mobile robot, and the mobile robot may obtain power to move from a battery. It would be beneficial to optimize the charging of the battery to provide for greater manufacturing efficiency.

SUMMARY

The disclosed embodiments provide a substrate transfer system including a mobile robot.

According to an aspect of the inventive concept, a substrate transfer system includes a mobile robot configured to handle a substrate carrier and including a power receiver; a mobile robot interface device configured to handle the substrate carrier and including a power feeder configured to supply an electromotive force to the power receiver of the mobile robot; at least one of: a first actuator configured to move the power feeder to adjust a distance between the power feeder and the power receiver and a second actuator configured to move the power receiver to adjust a distance between the power feeder and the power receiver; an identification tag disposed on any one of the mobile robot and the mobile robot interface device; a tag reader configured to recognize the identification tag; and a controller configured to control an operation of the mobile robot and to control an operation of the first and/or second actuator, wherein the controller is configured to control the first and/or second actuator to adjust the distance between the power feeder and the power receiver.

According to another aspect of the inventive concept, a substrate transfer system includes a mobile robot configured to handle a substrate carrier and including a power receiver; a mobile robot interface device configured to handle the substrate carrier and including a power feeder configured to supply an electromotive force to the power receiver of the mobile robot; at least one of: a first actuator configured to move the power feeder to adjust a distance between the power feeder and the power receiver, and a second actuator configured to move the power receiver to adjust a distance between the power feeder and the power receiver; one or more identification tags disposed on any one of the mobile robot and the mobile robot interface device; a tag reader configured to recognize the one or more identification tags; and a controller configured to control an operation of each of the mobile robot and the actuator, wherein the controller is configured to control at least one of the first actuator and the second actuator to adjust the distance between the power feeder and the power receiver, the controller is configured to control the mobile robot to align the mobile robot interface device and the mobile robot, and the power feeder is configured to supply the electromotive force to the power receiver by using a wireless method.

According to another aspect of the inventive concept, a substrate transfer system includes a mobile robot configured to handle a substrate carrier and including a power receiver; a mobile robot interface device configured to handle the substrate carrier and including a power feeder configured to supply an electromotive force to the power receiver of the mobile robot; an actuator system configured to move at least one of the power feeder and the power receiver to adjust a distance between the power feeder and the power receiver; a plurality of identification tags disposed on any one of the mobile robot and the mobile robot interface device; a tag reader configured to recognize the plurality of identification tags; and a controller configured to control an operation of each of the mobile robot and the actuator system, the controller is configured to control the actuator system to adjust the distance between the power feeder and the power receiver, the power feeder is configured to supply the electromotive force to the power receiver by using a wireless method, wherein the controller is configured to measure a horizontal separation distance between the mobile robot interface device and the mobile robot and a posture of the mobile robot, by using sizes of images of the plurality of identification tags and the relative positions of the images of the plurality of identification tags, and the controller is configured to control the mobile robot so that the mobile robot interface device and the mobile robot are aligned.

According to another aspect of the inventive concept, a method of transferring a substrate during a semiconductor device fabrication process includes receiving the substrate at a mobile robot; moving the mobile robot with the substrate, and aligning the mobile robot with a mobile robot interface device; transferring the substrate from the mobile robot to the mobile robot interface device; and while transferring the substrate from the mobile robot to the mobile robot interface device, charging a battery of the mobile robot.

According to another aspect of the inventive concept, a method of charging a mobile robot used during a semiconductor device fabrication process includes moving the mobile robot and aligning the mobile robot with a mobile robot interface device; transferring a substrate between the mobile robot and the mobile robot interface device; and while transferring the substrate from the mobile robot to the mobile robot interface device, wirelessly charging the mobile robot.

According to another aspect of the inventive concept, a method of manufacturing a semiconductor device includes receiving a substrate by a mobile robot interface device; transferring the substrate from the mobile robot interface device to a mobile robot; while transferring the substrate from the mobile robot interface device to the mobile robot, wirelessly charging the mobile robot; after transferring the substrate from the mobile robot interface device to the mobile robot, performing a series of processes on the substrate, including at least one process in a chamber; and dicing the substrate after performing the series of processes, to form singulated semiconductor chips.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
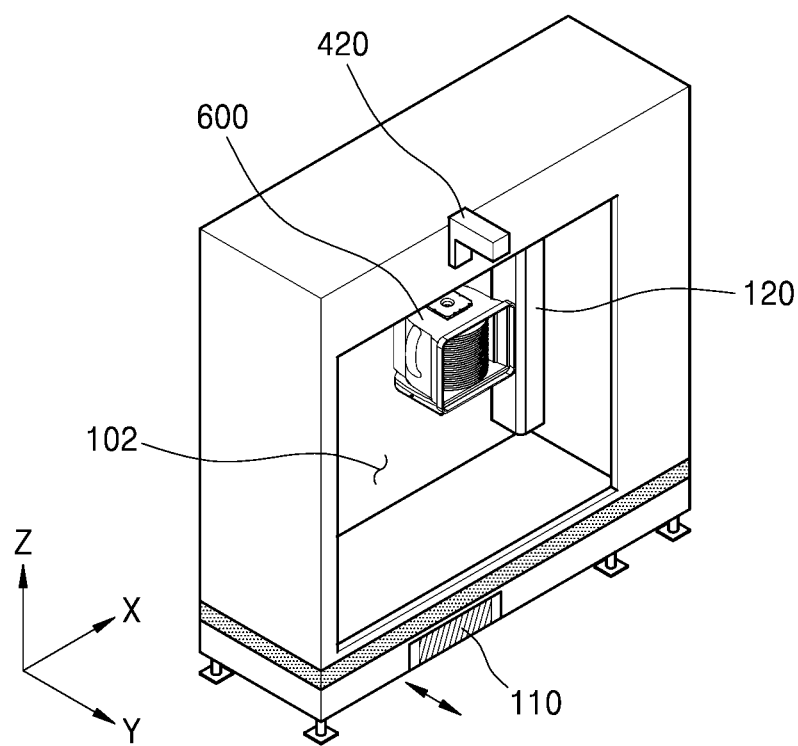
FIGS. 1A to 1E are diagrams illustrating a substrate transfer system, according to an embodiment of the inventive concept.

Hereinafter, embodiments will be described in detail with reference to the accompanying drawings. The same reference numerals are used for the same components in the drawings, and redundant descriptions thereof are omitted.

Figure 1B:
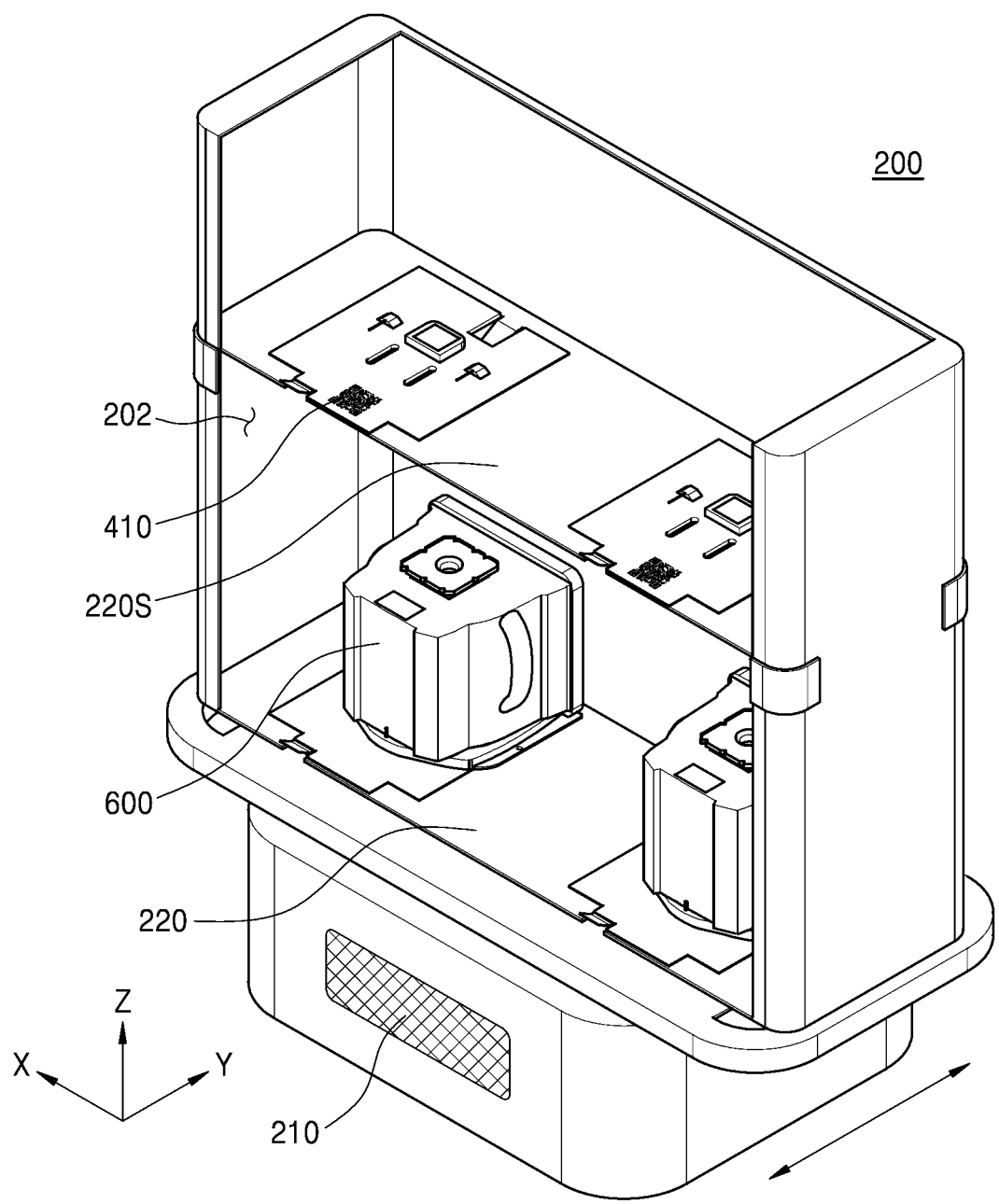
Figure 1C:
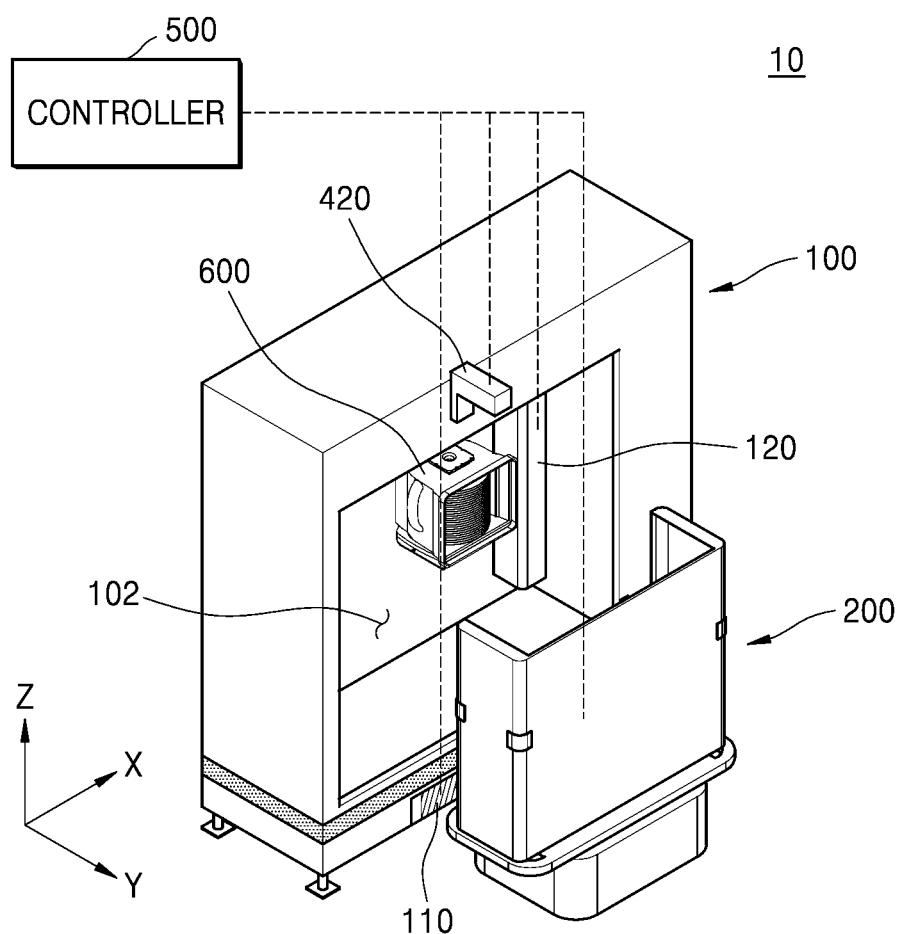
Figure 1D:
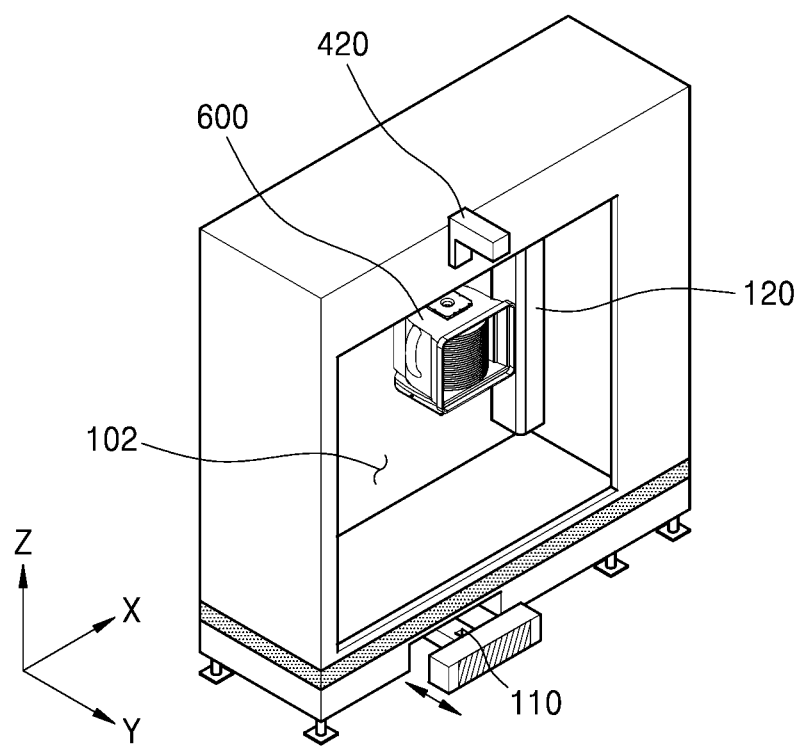
Figure 1E:
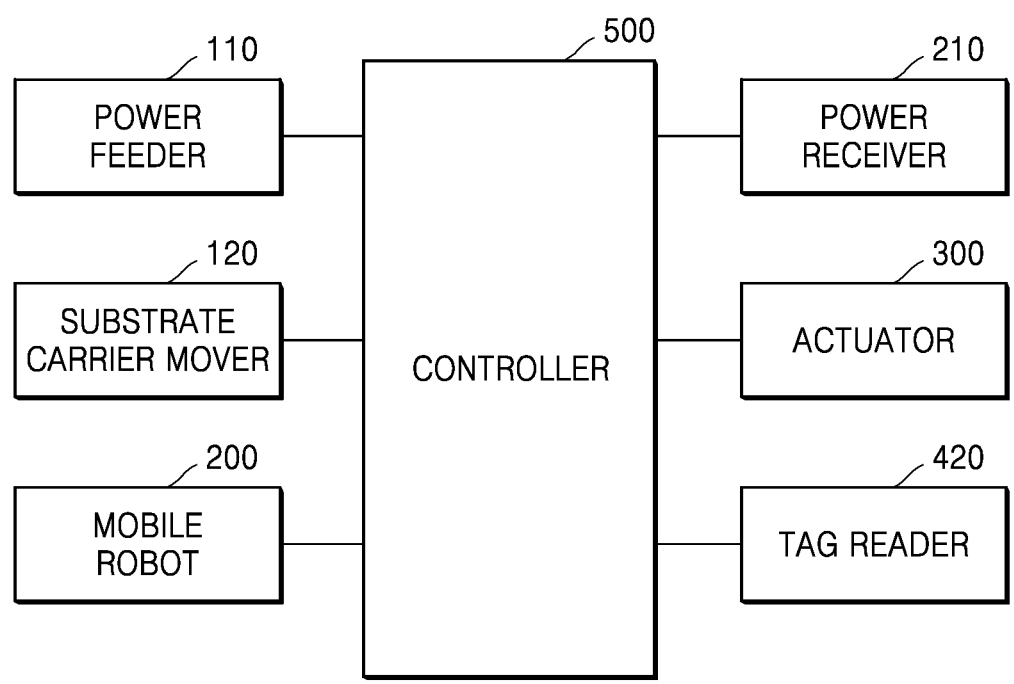

FIGS. 1A to 1E are diagrams illustrating a substrate transfer system 10, according to an embodiment of the inventive concept. FIG. 1A is a perspective view illustrating a mobile robot interface device 100 according to an embodiment of the inventive concept, and FIG. 1B is a perspective view illustrating a mobile robot 200 according to an embodiment of the inventive concept. FIG. 1C is a perspective view illustrating the mobile robot interface device 100 and the mobile robot 200 which are aligned according to an embodiment of the inventive concept. FIG. 1D is a perspective view illustrating a power feeder 110 moved to a charging position according to an embodiment of the inventive concept. FIG. 1E is a block diagram illustrating main circuit connections of components of the substrate transfer system 10 according to an embodiment of the inventive concept.

Referring to FIGS. 1A to 1E, the substrate transfer system 10 may include the mobile robot interface device 100, the mobile robot 200, an actuator 300, an identification tag 410, a tag reader 420, and a controller 500. The substrate transfer system 10 of the present embodiment may supply an electromotive force to a power receiver 210 of the mobile robot 200 while loading and unloading a substrate carrier 600 between the mobile robot interface device 100 and the mobile robot 200.

The mobile robot interface device 100, also described as a mobile robot interface station, may handle a substrate and/or a substrate carrier 600. For example, the mobile robot interface device 100 may store and/or mount the substrate and/or the substrate carrier 600. The mobile robot interface device 100 may receive or transfer the substrate and/or the substrate carrier 600 from or to the mobile robot 200 to load and unload the substrate and/or the substrate carrier 600. The position of the mobile robot interface device 100 may be fixed inside a semiconductor facility. The mobile robot interface device 100 may include a mobile robot interface device opening portion 102 in one surface of the mobile robot interface device 100. For example, the mobile device opening portion 102 may be an opening at one side of the mobile robot interface device 100, and may open the mobile robot interface device 100 to a loading region or a loading compartment. The side that includes the opening 102 through which the substrate and/or the substrate carrier 600 are loaded or unloaded may be described as a front side, and a side opposite the front side (e.g., which may not include an opening) may be described as a rear side. Through the mobile robot interface device opening portion 102, the substrate carrier 600 may be brought into or taken out of the mobile robot interface device 100. In addition, the mobile robot interface device 100 may include the power feeder 110 and a substrate carrier mover 120.

The power feeder 110 may supply the electromotive force to the power receiver 210 of the mobile robot 200. For example, the power feeder 110 may supply the electromotive force to the power receiver 210 using a wireless charging method. The power feeder 110 may use, for example, an inductor such as a wireless charging coil, and the power receiver 210 may similarly use an inductive coil. For example, the power feeder 110 may be disposed adjacent to a bottom side (e.g., a bottom) of the mobile robot interface device 100 (e.g., at the front side of the mobile robot interface device 100). According to an embodiment of the inventive concept, the power feeder 110 may be movable in a horizontal direction (e.g., an X direction and/or a Y direction). For example, when the power feeder 110 does not protrude to the outside of the mobile robot interface device 100, the power feeder 110 may be considered as being located at a basic position, also described as a non-extended position, compared to an extended position where it protrudes.

The substrate carrier mover 120 may bring the substrate carrier 600 into the mobile robot interface device 100, or may take the substrate carrier 600 out of the mobile robot interface device 100. For example, the substrate carrier mover 120 may pick up the substrate carrier 600 disposed on a plate 220 of the mobile robot 200 and bring the substrate carrier 600 into the mobile robot interface device 100. Also, the substrate carrier mover 120 may load the substrate carrier 600 disposed inside the mobile robot interface device 100 onto the plate 220 of the mobile robot 200. The substrate carrier mover 120 may be formed of known components, such as one or more rotatable or translatable arms connected to respective actuators and controlled by a controller, and a gripper connected to the one or more arms, and may be described as a substrate carrier transport.

The mobile robot 200 may handle, e.g., store and/or transfer, the substrate and/or the substrate carrier 600. The mobile robot 200 may move inside the semiconductor facility. The mobile robot 200 may transfer the substrate and/or the substrate carrier 600 between a plurality of mobile robot interface devices 100. The mobile robot 200 may be configured to travel on a stage of the semiconductor facility in which the mobile robot interface device 100 is disposed. For example, the mobile robot 200 may include a traveling wheel (or a plurality of wheels) and a traveling motor. One or more traveling wheels may be connected to a driving motor.

The mobile robot 200 may include a mobile robot opening portion 202 to bring and/or take the substrate and/or the substrate carrier 600 in at least one of its sides (e.g., a front side). For example, the mobile robot opening portion 202 may be an opening in one surface of the mobile robot 200, and may open the mobile robot 200 to a loading region, or a loading compartment. Through the mobile robot opening portion 202, the substrate carrier 600 may be brought into the mobile robot 200 or taken out of the mobile robot 200. Also, the mobile robot 200 may include the power receiver 210 and the plate 220.

The power receiver 210 may receive the electromotive force via the power feeder 110. Accordingly, the battery of the mobile robot 200 may be charged. Also, the battery may supply power to the mobile robot 200. For example, the power receiver 210 may be disposed adjacent to a bottom side (e.g., a bottom) of the mobile robot 200 (e.g., at the front side of the mobile robot 200). According to an embodiment of the inventive concept, the power receiver 210 may be configured to be movable in the horizontal direction (e.g., the X direction and/or the Y direction). For example, the mobile robot 200 may include the actuator 300 to move the power receiver 210. For example, when the power receiver 210 does not protrude to the outside of the mobile robot 200, the power receiver 210 may be considered as being located at a basic position, also described as a non-extended position, compared to an extended position where it protrudes.

In addition, the mobile robot 200 may include the plate 220 on which the substrate carrier 600 may be supported. The specification of the plate 220 may be determined according to the specification of the substrate carrier 600. For example, a horizontal area of the plate 220 may be greater than a horizontal area of a bottom part of the substrate carrier 600. One mobile robot 200 may include a plurality of plates 220 having a multilayer structure, and the plurality of plates 220 may be disposed in a plurality of layers inside the mobile robot 200. In FIG. 1B, one mobile robot 200 includes two plates 220, and each plate 220 loads two substrate carriers 600, but one mobile robot 200 may include one plate 220 or may include three or more plates 220, and each plate 220 may load one substrate carrier 600 or three or more substrate carriers 600. The plates 220 may be described generally as platforms, and may also be described as shelves, or racks.

A first horizontal direction (an X direction) and a second horizontal direction (a Y direction) may be directions parallel to a main surface of the stage on which the mobile robot interface device 100 or the mobile robot 200 is disposed. The stage may be, for example, a floor, or may be raised above and parallel to a floor. Also, a vertical direction (a Z direction) may be a direction perpendicular to the main surface of the stage.

Among the plurality of plates 220, the plate 220 on which the identification tag 410 is disposed may be referred to as a sensing plate 220S. In one embodiment, the identification tag 410 may be disposed on a top side (e.g., top surface) of the sensing plate 220S. Also, as described above, the sensing plate 220S may load the substrate carrier 600. Even when the substrate carrier 600 is loaded on the sensing plate 220S, the identification tag 410 may be configured to be captured by the tag reader 420. For example, the identification tag 410 may be disposed on the uppermost plate 220 among the plurality of plates 220 of the mobile robot 200. For example, the sensing plate 220S may be the plate 220 located at the uppermost end of the plurality of plates 220 of the mobile robot 200. Also, the identification tag 410 may be disposed at a location that is still viewable when a substrate carrier 600 is loaded on the same plate as the identification tag 410. For example, the identification tag 410 may be exposed and in front of (in the Y-direction as shown in FIG. 1B) a substrate carrier 600 loaded on the sensing plate 220S.

The actuator 300 may be connected to the power feeder 110 and/or the power receiver 210 through a shaft, and may move the power feeder 110 and/or the power receiver 210 in the horizontal direction (e.g., X direction and/or Y direction). The actuator 300 may convert the relative positions of the power feeder 110 and the power receiver 210 to charging positions and/or charging end positions. The charging position may mean a position where the power receiver 210 is supplied with the electromotive force by the power feeder 110, and the charging end position may mean a case where at least one of the power feeder 110 and the power receiver 210 is not located at the charging position. When the power receiver 210 and the power feeder 110 are respectively located at the charging positions, a distance between the power receiver 210 and the power feeder 110 may be within an appropriate range so that the electromotive force is supplied to the power receiver 210 by the power feeder 110. When any one of the power receiver 210 and the power feeder 110 is located at the charging end position, the distance between the power receiver 210 and the power feeder 110 may be beyond the appropriate range, and thus the electromotive force may not be or may not be properly supplied to the power receiver 210 by the power feeder 110.

In an embodiment, the actuator 300 may adjust a horizontal position of the power feeder 110. In an embodiment, the actuator 300 may adjust a horizontal position of the power receiver 210. In an embodiment, an actuator 300 may be included in one or both of the mobile robot interface device 100 and the mobile robot 200 to adjust both the horizontal position of the power feeder 110 and the horizontal position of the power receiver 210. For example, each actuator 300 may include a linear motor, or plurality of linear motors and/or one or more additional connectors to provide for horizontal movement in the X direction and Y direction). The actuator or actuators may be controlled using controller 500, and together the actuator or actuators used to control horizontal positions of the power feeder 110 and the power receiver 210 may be described as an actuator system.

The identification tag 410 may be disposed on the sensing plate 220S or may be disposed on or adjacent to a top side or surface of the mobile robot interface device 100. When the identification tag 410 is disposed on the sensing plate 220S, the tag reader 420 may be disposed in or on the mobile robot interface device 100, and when the identification tag 410 is disposed on the mobile robot interface device 100, the tag reader 420 may be disposed in or on the mobile robot 200. The mobile robot interface device opening portion 102 is disposed on a front side of the mobile robot interface device 100, and the substrate carrier 600 moves through the mobile robot interface device opening portion 102, and thus the identification tag 410 or the tag reader 420 may be disposed adjacent to the top side or front side of the mobile robot interface device 100. In addition, the mobile robot opening portion 202 is disposed on a front side and top side of the mobile robot 200, and the substrate carrier 600 moves through the mobile robot opening portion 202, and thus the identification tag 410 or the tag reader 420 may be disposed adjacent to the front side and/or top side of the mobile robot 200.

The identification tag 410 is disposed on the sensing plate 220S, and the tag reader 420 may identify and recognize the identification tag 410. The tag reader 420 may include means for identifying and recognizing the identification tag 410, for example, an image capture device such as a camera or reader such as a bar code reader, analysis software and/or hardware, etc., and which may include a lens or lens system, an image sensor, an illumination light (e.g., a laser or LED light), etc. Based on information obtained by the tag reader 420 capturing the identification tag 410, the controller 500 may detect the distance between the mobile robot interface device 100 and the mobile robot 200. For example, the identification tag 410 may be a quick response (QR) code and/or a barcode, or may be any other computer-recognizable symbol or code, and the term "tag" used herein includes any of these examples. The identification tag 410 may be etched or printed on a portion of the sensing plate 220S, or may be included on a label placed on the sensing plate 220S. The tag reader 420 may capture the identification tag 410 using an image-based method. According to an embodiment of the inventive concept, an alignment direction of the power feeder 110 and the power receiver 210 (or a movement direction between the charging position and the charging end position of any one of the power feeder 110 and the power receiver 210) and a capture direction of the tag reader 420 may be perpendicular to each other. That is, the power feeder 110 and the power receiver 210 may be aligned in the horizontal direction (e.g., X direction and/or Y direction), and the capture direction of the tag reader 420 may be the vertical direction (Z direction). The capture direction may refer to a direction perpendicular to a flat image sensor (e.g., CMOS or CCD image sensor) of the tag reader 420, and/or perpendicular to a focal plane of an image capture device of the tag reader 420. For example, the alignment direction of the power feeder 110 and the power receiver 210 and a long axis direction of the sensing plate 220S and/or a short axis direction of the sensing plate 220S may be parallel to each other. Accordingly, the long axis direction of the sensing plate 220S and/or the short axis direction of the sensing plate 220S may be in a horizontal direction (e.g., an X direction and/or a Y direction). When the alignment direction of the power feeder 110 and the power receiver 210 and the capture direction of the tag reader 420 are perpendicular to each other, it may be easy to align the mobile robot interface device 100 and the mobile robot 200, control a horizontal separation distance between the mobile robot interface device 100 and the mobile robot 200, and control a horizontal separation distance between the power feeder 110 and the power receiver 210. However, the alignment direction of the power feeder 110 and the power receiver 210 (or a movement direction between the charging position and the charging end position of any one of the power feeder 110 and the power receiver 210) and a capture direction of the tag reader 420 may not be perpendicular to each other, and may be, for example, oblique with respect to each other. As long as the angle and orientation between the alignment and/or movement direction of the power feeder 110 and power receiver 210 and the capture direction of the tag reader 420 is known, various positional data can be obtained regarding the identification tags 410.

In FIG. 1B, two identification tags 410 are disposed on the sensing plate 220S, but one identification tag 410 or three or more identification tags 410 may be disposed on the sensing plate 220S. When a plurality of identification tags 410 are disposed on the sensing plate 220S, the tag reader 420 may capture the plurality of identification tags 410. The controller 500 may calculate a size of an image of each of the plurality of identification tags 410 and/or a relative position of the image of each of the plurality of identification tags 410.

The controller 500 may control the power feeder 110, the substrate carrier mover 120, the mobile robot 200, the power receiver 210, the actuator(s) 300, and/or the tag reader 420. In one embodiment, when the distance between the power feeder 110 and the power receiver 210 is within a certain range, the controller 500 may control the power feeder 110 to supply the electromotive force to the power receiver 210. For example, when the distance between the power feeder 110 and the power receiver 210 is in a range of about 30 mm to about 50 mm, which may be a distance at which optimal charging occurs, the controller 500 may control the power feeder 110 to supply the electromotive force to the power receiver 210. Optimal charging may refer to a charging state that would allow for full charging within a preset time period while using an amount of energy within a predetermined range, for example, to maximize efficiency. In order to change the distance between the power feeder 110 and the power receiver 210, the controller 500 may drive the actuator(s) 300.

The controller 500 may receive data from one or more sensors disposed on or in different components of the substrate transfer system 10. The controller 500 may adjust the distance between the power feeder 110 and the power receiver 210 based on this data, which may include, for example, a charging voltage, a charging current, and/or a temperature of the power feeder 110, and/or which may include a charging voltage, a charging current, and/or a temperature of the battery of the mobile robot 200. The controller 500 may control the operation of the actuator 300 to adjust the distance between the power feeder 110 and the power receiver 210. For example, the controller 500 may make the distance between the power feeder 110 and the power receiver 210 shorter if the charging voltage or current is below a threshold value, and/or if the temperature is below a particular value, or may make the distance between the power feeder 110 and the power receiver 210 longer if the charging voltage or current is above a threshold value, and/or if the temperature is above a particular value.

In addition, the controller 500 may control the actuator 300 based on the operation of the substrate carrier mover 120 of the mobile robot interface device 100. For example, while the substrate carrier mover 120 is moving, the controller 500 may adjust the distance between the power feeder 110 and the power receiver 210 (e.g., by moving the power feeder 110 and/or power receiver 210 without otherwise moving the location of the mobile robot 200). Accordingly, while the substrate carrier mover 120 is moving, the power feeder 110 may supply the electromotive force to the power receiver 210.

Also, the controller 500 may control the movement of the mobile robot 200. That is, the controller 500 may control the posture (e.g., position and/or location) of the mobile robot 200. The posture may include the first horizontal direction (the X direction), the second horizontal direction (the Y direction) of the mobile robot 200 and/or an alignment state of the mobile robot 200 and the mobile robot interface device 100 (e.g., a misaligned angle of the mobile robot interface device 100 and the mobile robot 200).

According to an embodiment of the inventive concept, the controller 500 may control the movement of the mobile robot 200 so that the mobile robot interface device opening portion 102 and the mobile robot opening portion 202 face each other or are aligned (e.g., so that the planes formed by the front of the opening portions 102 and 202 are parallel to each other and so that outer edges in the X-direction of the opening portion 202 of the mobile robot 200 are fully within the outer edges in the X-direction of the opening portion 102 of the mobile robot interface device 100). In addition, the controller 500 may control the mobile robot 200 so that the mobile robot interface device 100 and the mobile robot 200 are disposed with a horizontal separation distance (e.g., in the Y-direction) of about 7 cm to about 15 cm. The horizontal separation distance between the mobile robot interface device 100 and the mobile robot 200 may be calculated based on the information obtained by the tag reader 420 capturing the identification tag 410. For example, the tag reader 420 may capture the plurality of identification tags 410. Using the size of the image of each of the plurality of identification tags 410 and the relative position of the images of each of the plurality of identification tags 410, the controller 500 may calculate and control the horizontal separation distance between the mobile robot interface device 100 and the mobile robot 200 and an angle between the mobile robot interface device 100 and the mobile robot 200, respectively. For example, the controller 500 may measure the size of the image of the identification tag 410 captured by the tag reader 420 to measure the horizontal separation distance between the mobile robot interface device 100 and the mobile robot 200.

For example, when the horizontal separation distance between the mobile robot interface device 100 and the mobile robot 200 is relatively distant, the size of the image of the identification tag 410 captured by the tag reader 420 is may be relatively small. In addition, when the horizontal separation distance between the mobile robot interface device 100 and the mobile robot 200 is relatively near, the size of the image of the identification tag 410 captured by the tag reader 420 is relatively large. The controller 500 may calculate the size of the image of the identification tag 410 by using a number of pixels occupied by the image of the identification tag 410. When a plurality of the identification tags 410 are disposed on the sensing plate 220S, the controller 500 may compare sizes of images of the plurality of identification tags 410 to determine whether the mobile robot interface device 100 and the mobile robot 200 are aligned. When the mobile robot interface device opening portion 102 and the mobile robot opening portion 202 of the front side of the mobile robot 200 face each other, and an extension direction of a horizontal edge of the mobile robot interface device opening portion 102 and an extension direction of a horizontal edge of mobile robot opening portion 202 of the front side of the mobile robot 200 are parallel to each other, the controller 500 may determine that the mobile robot interface device 100 and the mobile robot 200 are aligned. When there is only one identification tag 410, a method of aligning the mobile robot interface device 100 and the mobile robot 200 will be described in detail with reference to FIG. 3.

After the mobile robot interface device opening portion 102 and the mobile robot opening portion 202 are aligned facing each other, the controller 500 may control the substrate carrier 600 to be transferred between the mobile robot interface device 100 and the mobile robot 200. The controller 500 may control the substrate carrier mover 120 to transfer the substrate carrier 600 from the mobile robot interface device 100 to the mobile robot 200 or from the mobile robot 200 to the mobile robot interface device 100.

When the substrate carrier 600 is transferred between the mobile robot interface device 100 and the mobile robot 200, the controller 500 may control the power feeder 110 to supply the electromotive force to the power receiver 210. When the substrate carrier 600 is wholly transferred between the mobile robot interface device 100 and the mobile robot 200, the controller 500 may control the power feeder 110 to end supplying the electromotive force to the power receiver 210. According to another embodiment, as long as the mobile robot 200 and mobile robot interface device 100 are aligned, stationary, and within a predetermined distance of each other, the controller 500 may control the power feeder 110 to supply the electromotive force to the power receiver 210, until a time when the battery of the mobile robot 200 is charged more than a target charging amount. At that point, the controller 500 may control the power feeder 110 to end supply the electromotive force to the power receiver 210. For example, the target charging amount may mean a charge amount equal to or greater than a particular percentage (e.g., about 60%, about 80%, somewhere therebetween, or another percentage) of the maximum charging amount of the battery of the mobile robot 200. When the charging is completed, the controller 500 may control the actuator 300 to move the power feeder 110 and/or the power receiver 210 to a basic position. Thereafter, the controller 500 may move the mobile robot 200.

The controller 500 may be implemented as hardware, firmware, software, or any combination thereof. For example, the controller 500 may be a computing device such as a workstation computer, a desktop computer, a laptop computer, or a tablet computer. In addition, the controller 500 may include input/output (I/O) devices configured to provide input and/or output (e.g., keyboard, mouse, display, speakers, printers, modems, network cards, etc. For example, the controller 500 may include a memory device such as read only memory (ROM) and random access memory (RAM), and a processor configured to perform certain operation and algorithm, for example, a microprocessor, a central processing unit (CPU), a graphics processing unit (GPU), etc. Also, the controller 500 may include a receiver and a transmitter receiving and transmitting electrical signals. The controller 500 may be housed partly or wholly in the mobile robot interface device 100, partly or wholly in the mobile robot 200, or partly or wholly in a computer or system outside of both the mobile robot interface device 100 and mobile robot 200. The controller 500 may include portions that communicate with the mobile robot interface device 100 wirelessly or in a wired manner, and may communicate with the mobile robot 200 wirelessly or in a wired manner, and may be composed of a combination of hardware and software located in different locations including the mobile robot interface device 100, the mobile robot 200, and/or an external device.

The substrate carrier 600 may be a carrier including an opening portion which the substrate may be brought into and/or taken out of and a slot on which the substrate is loaded. The substrate carrier 600 may protect the loaded substrate from contamination and securely fix the loaded substrate. The substrate carrier 600 may be used, for example, for automated logistics of semiconductor device manufacturing, such as cleaning, loading, storage, and transfer of the substrate. The substrate carrier 600 may support the substrate.

For example, a front opening unified pod corresponds to an example of the substrate carrier 600 supported by the plate 220, and a target object supported by the plate 220 is not limited thereto. For example, the plate 220 may support a front opening shipping box.

The diameter of each substrate may be about 300 mm, but is not limited thereto. The diameter of the substrate may be, for example, about 150 mm, about 200 mm, or about 450 mm, or more. The substrate may be, for example, a silicon substrate for manufacturing a semiconductor device, but is not limited thereto. The substrate may be any one of a SiC substrate, a GaAs substrate, a GaN substrate, and a sapphire substrate.

The substrate carrier 600 may include a plurality of slots configured to mount a plurality of respective substrates therein. A plurality of substrates may be stacked to vertically overlap each other along the slots.

Because the mobile robot interface device of a typical substrate transfer system does not include a power feeder, in order to charge a battery of a mobile robot, it is typically necessary to additionally move the mobile robot to a charging port provided separately in a semiconductor facility. In addition, in typical systems, when a substrate carrier is unloaded and loaded between the mobile robot interface device and the mobile robot, because the battery of the mobile robot cannot be charged at that time, a process of additionally charging the battery of the mobile robot is required.

On the other hand, the substrate transfer system 10 of the disclosed embodiments includes the mobile robot interface device 100 including the power feeder 110 so that the power feeder 110 may supply the electromotive force to the power receiver 210 of the mobile robot 200 using a wireless method. Accordingly, the battery of the mobile robot 200 may be charged by the power feeder 110. In addition, the identification tag 410 may be disposed on the sensing plate 220S adjacent to the top side of the mobile robot 200 so that the controller 500 may calculate the horizontal separation distance between the mobile robot interface device 100 and the mobile robot 200, and identify the alignment state of the mobile robot interface device 100 and the mobile robot 200. Further, while the substrate carrier 600 is being unloaded and loaded between the mobile robot interface device 100 and the mobile robot 200, the power receiver 210 of the mobile robot 200 may be supplied with electromotive force by the power feeder 110 to charge the mobile robot 200, and thus, the convenience and rapidity of the manufacturing process may be obtained. In addition, an actuator 300 is connected to the power feeder 110 and/or the power receiver 210, and thus, the horizontal separation distance between the power feeder 110 and the power receiver 210 may be adjusted.

Figure 2A:
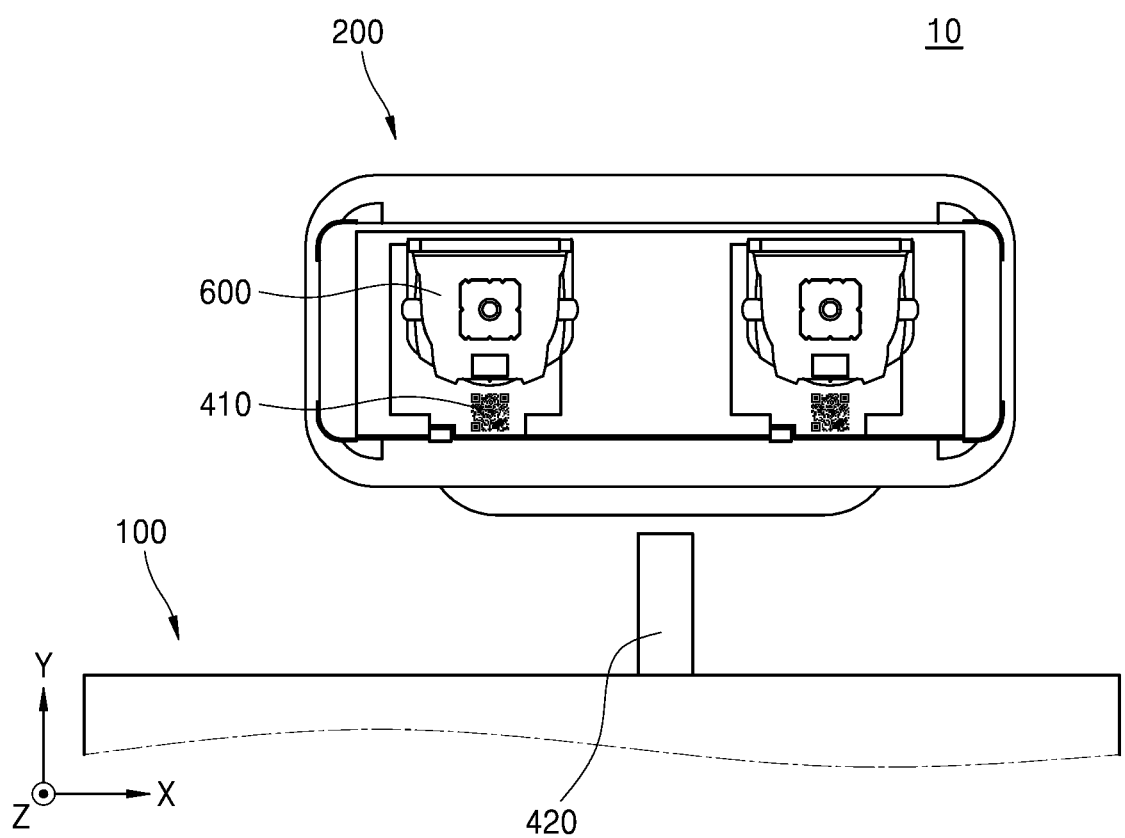
FIG. 2A is a top view of the substrate transfer system, according to an embodiment of the inventive concept.
Figure 2B:
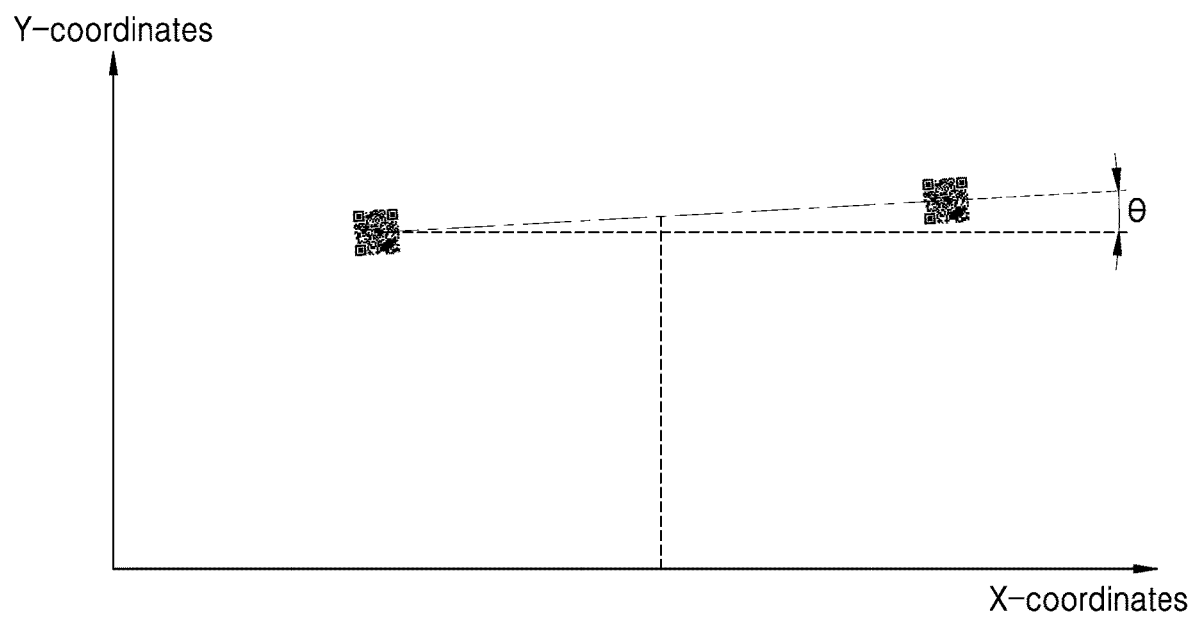
FIG. 2B is a diagram illustrating an image obtained by capturing a plurality of identification tags with a tag reader according to an embodiment of the inventive concept.

FIG. 2A is a top view of the substrate transfer system 10, according to an embodiment of the inventive concept. FIG. 2B is a diagram illustrating an image obtained by capturing a plurality of identification tags 410 with the tag reader 420 according to an embodiment of the inventive concept.

Referring to FIGS. 1A to 2B, the plurality of identification tags 410 may be disposed on the sensing plate 220S adjacent to a top side of the mobile robot 200. Also, the tag reader 420 may be disposed adjacent to a top side of the mobile robot interface device 100. The tag reader 420 may recognize the plurality of identification tags 410, the controller 500 may calculate and/or control a horizontal separation distance between the mobile robot interface device 100 and the mobile robot 200, and an alignment angle between the mobile robot interface device 100 and the mobile robot 200.

Referring to FIGS. 1A to 2B, the tag reader 420 may capture the plurality of identification tags 410. An extension direction of an X axis coordinate of FIG. 2B may be, for example, the same as a long axis direction of the sensing plate 220S on which the identification tags 410 are disposed. FIG. 2B illustrates a case in which a line extending from the center of each image of the identification tag 410 captured by the tag reader 420 is not aligned with the X-axis coordinate. For example, the line extending from the center of each image of the identification tag 410 captured by the tag reader 420 forms an angle by θ with an extension direction of the X-axis coordinate. In this case, the controller 500 may control the movement of the mobile robot 200 so that the line extending from the center of each image of the identification tag 410 captured by the tag reader 420 is parallel to the extension direction of the X-axis coordinate. After the mobile robot interface device 100 and the mobile robot 200 are aligned, the power feeder 110 may supply an electromotive force to the power receiver 210.

Figure 3:
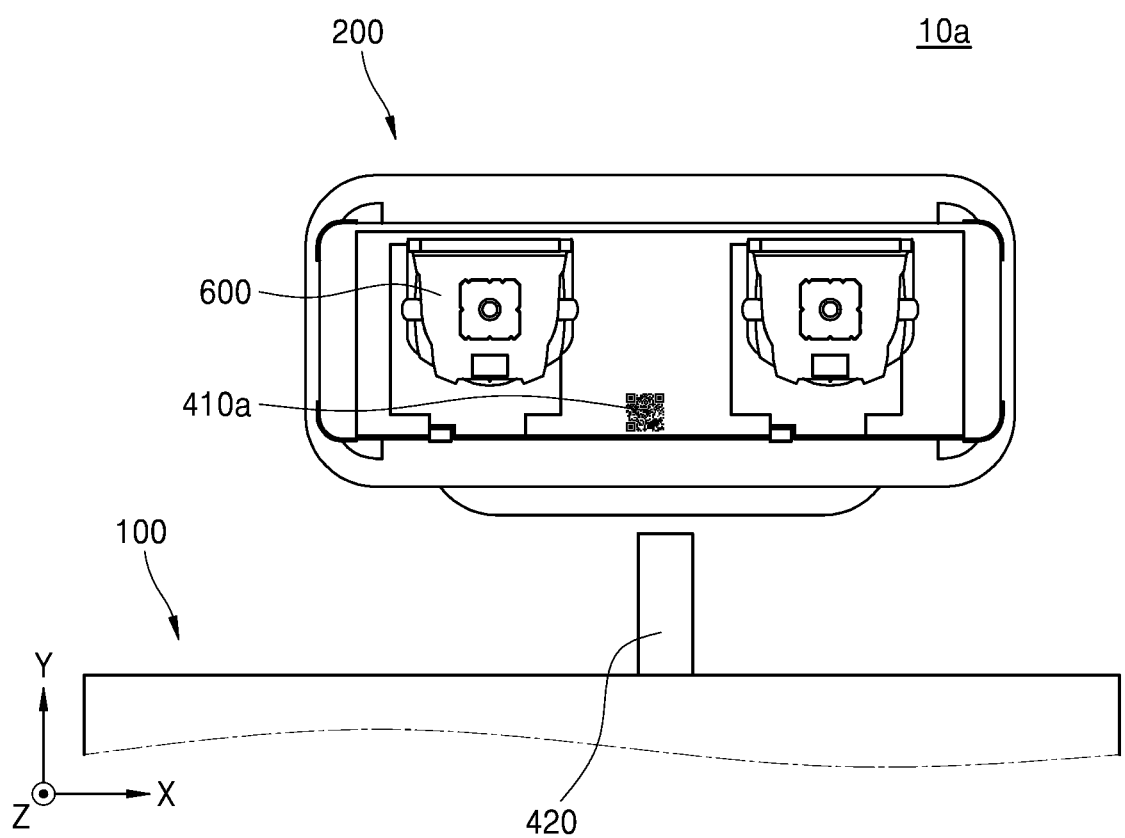
FIG. 3 is a top view illustrating a substrate transfer system according to an embodiment of the inventive concept.

FIG. 3 is a perspective view illustrating a substrate transfer system 10a according to an embodiment of the inventive concept.

Referring to FIG. 3, the substrate transfer system 10a of the present embodiment may include the mobile robot interface device 100, the mobile robot 200, the actuator 300, an identification tag 410a, the tag reader 420, and the controller 500. The mobile robot interface device 100, the mobile robot 200, the actuator 300, the tag reader 420, and the controller 500 of FIG. 3 may be substantially the same as the mobile robot interface device 100, the mobile robot 200, the actuator 300, the tag reader 420, and the controller 500 of the substrate transfer system 10 of FIG. 1C, respectively. Therefore, only the identification tag 410a will be described herein.

In one embodiment, only one identification tag 410a is disposed on the sensing plate 220S of the mobile robot 200. Also, an alignment direction of the power feeder 110 and the power receiver 210 and a capture direction of the tag reader 420 may be perpendicular to each other. The controller 500 may calculate a horizontal separation distance between the mobile robot interface device 100 and the mobile robot 200, with respect to a size of an image of the identification tag 410a captured by the tag reader 420 or a position of the captured image of the identification tag 410a. For example, when the center of the image of the identification tag 410a is located on a previously determined reference point of the image, the controller 500 may determine that the mobile robot interface device 100 and the mobile robot 200 are disposed at positions for an unloading and loading operation of the substrate carrier 600. In another embodiment, the controller 500 may calculate the size of the image of the identification tag 410a by using a size of pixels occupied by the image of the identification tag 410a. In addition, the controller 500 may calculate a horizontal separation distance between the mobile robot interface device 100 and the mobile robot 200 through the position of the image of the identification tag 410a captured by the tag reader 420. For example, when the center of the identification tag 410a and the center of the tag reader 420 are aligned in a vertical direction, the controller 500 may determine that the mobile robot interface device 100 and the mobile robot 200 are disposed at the positions for the unloading and loading operation of the substrate carrier 600. The controller 500 may also determine and control for a proper alignment of the mobile robot interface device 100 and the mobile robot 200 using the identification tag 410a. For example, if the identification tag 410a is a QR code, alignment can be determined based on known QR code alignment principles.

Figure 4:
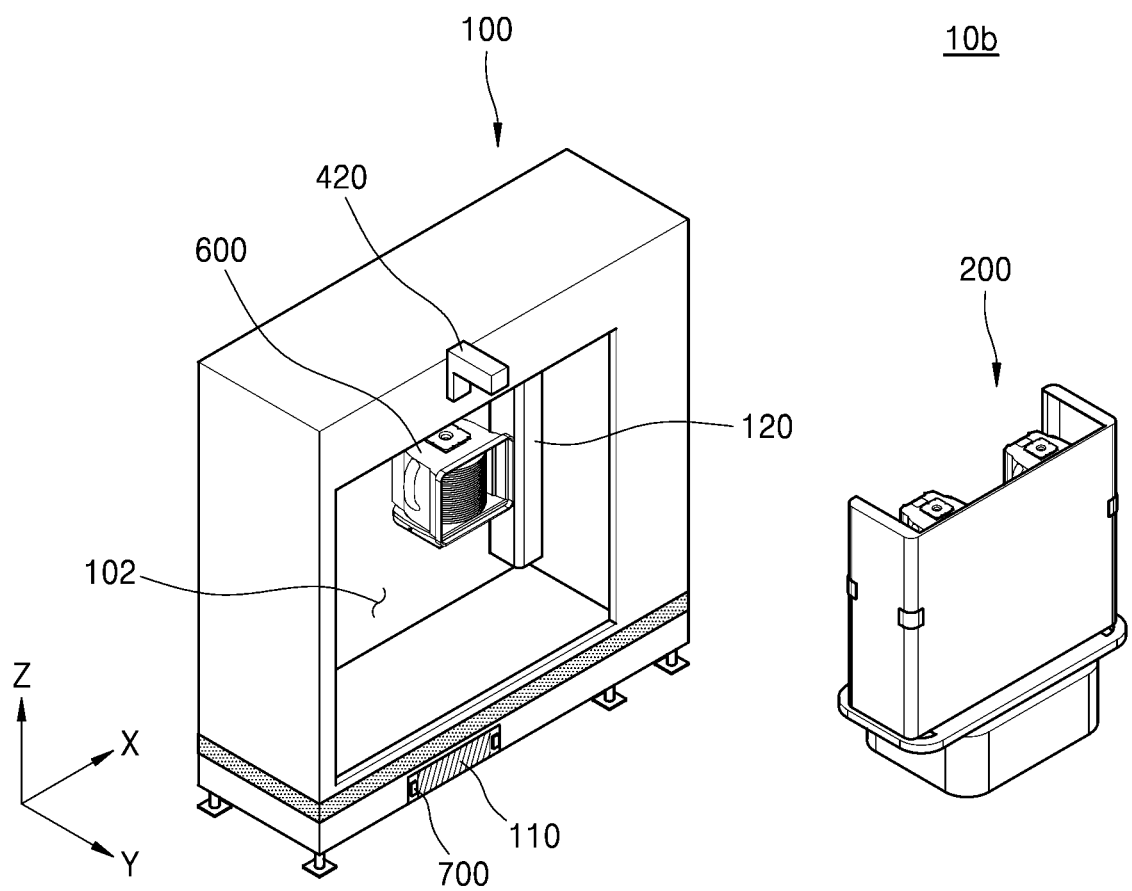
FIG. 4 is a perspective view illustrating a substrate transfer system according to an embodiment of the inventive concept.

FIG. 4 is a perspective view illustrating a substrate transfer system 10b according to an embodiment of the inventive concept.

Referring to FIG. 4, the substrate transfer system 10b of the present embodiment may include the mobile robot interface device 100, the mobile robot 200, the actuator 300, the identification tag 410, the tag reader 420, the controller 500, and a distance measuring sensor 700. The mobile robot interface device 100, the mobile robot 200, the actuator 300, the identification tag 410, the tag reader 420 and the controller 500 of FIG. 4 may be substantially the same as the mobile robot interface device 100, the mobile robot 200, the actuator 300, the identification tag 410, the tag reader 420 and the controller 500 of the substrate transfer system 10 of FIG. 1C, respectively. Therefore, only the distance measuring sensor 700 will be described herein.

The distance measuring sensor 700 may measure a distance between the power feeder 110 and the power receiver 210. According to an embodiment of the inventive concept, the distance measuring sensor 700 may be disposed on the power feeder 110 and/or the power receiver 210. For example, the distance measuring sensor 700 may be an image-based sensor, or a laser-based sensor. For example, the distance measuring sensor 700 may measure the distance between the power feeder 110 and the power receiver 210 using a time of flight (TOF) method. After aligning the mobile robot interface device 100 and the mobile robot 200, the controller 500 may control the actuator 300 to change the distance between the power feeder 110 and the power receiver 210. Based on the distance between the power feeder 110 and the power receiver 210 measured by the distance measuring sensor 700, the controller 500 may determine whether to operate the power feeder 110. As described above, when the distance between the power feeder 110 and the power receiver 210 is in a range of about 30 mm to about 50 mm, the controller 500 may control the power feeder 110 to supply an electromotive force to the power receiver 210.

Figure 5A:
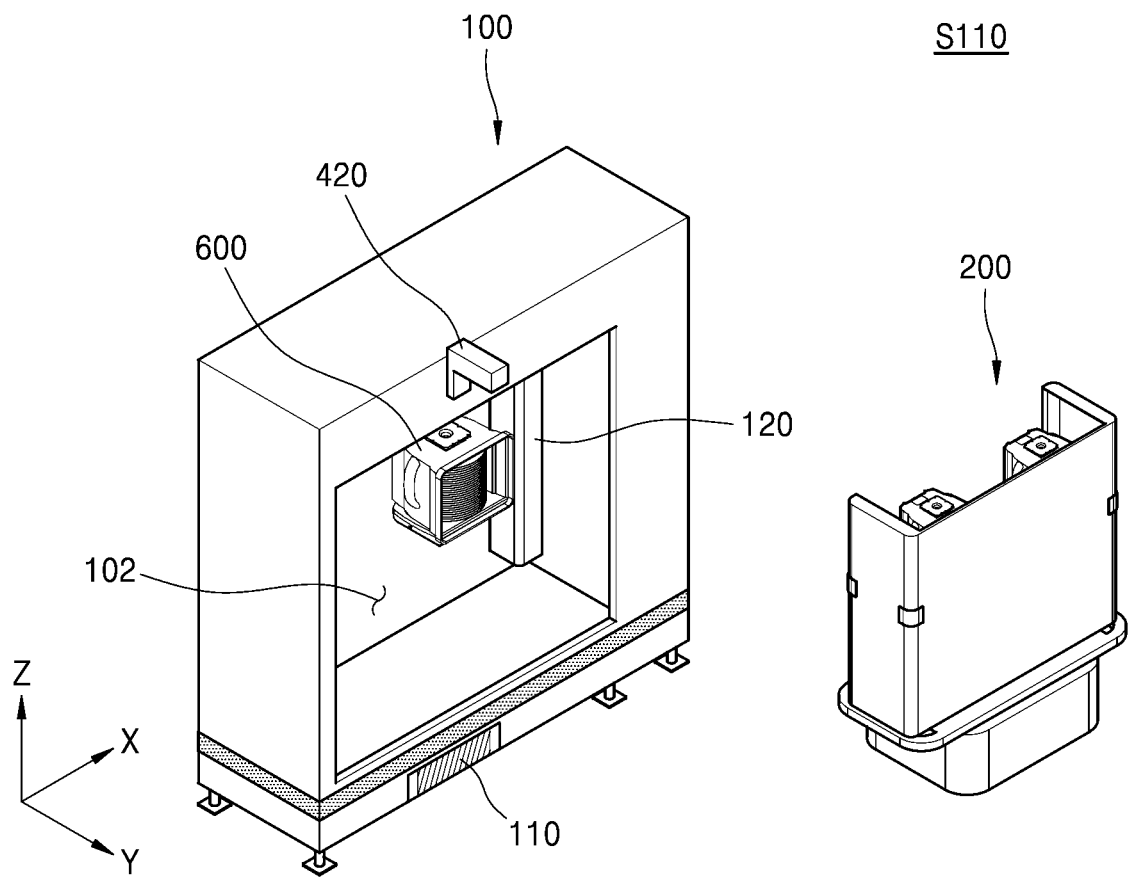
FIGS. 5A to 5C are perspective views illustrating a substrate transfer method according to an embodiment of the inventive concept.
Figure 5B:
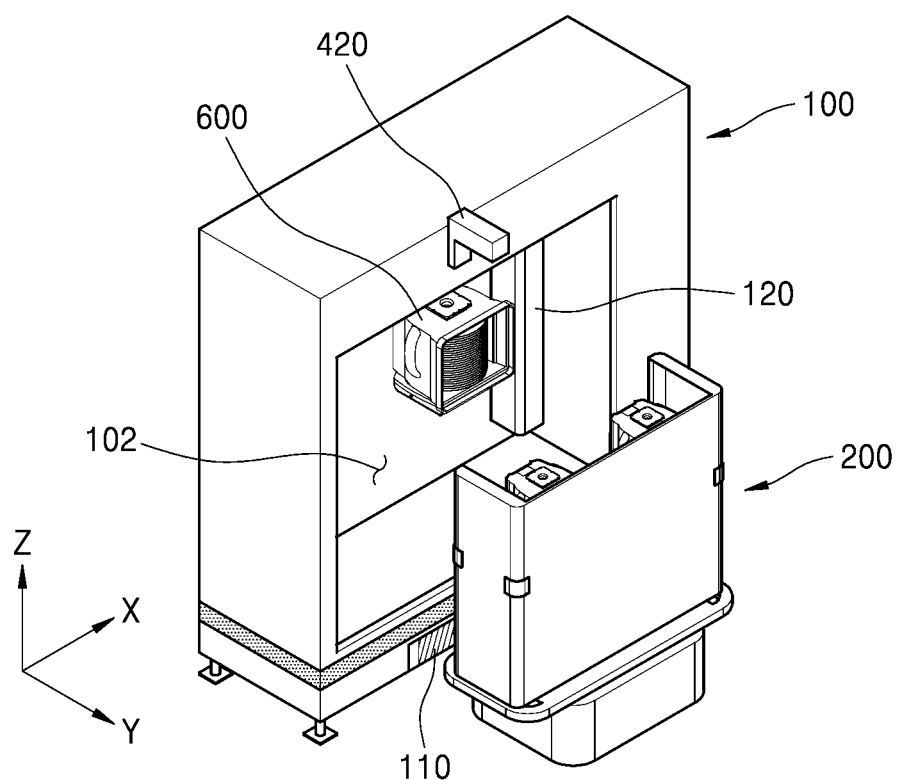
Figure 5C:
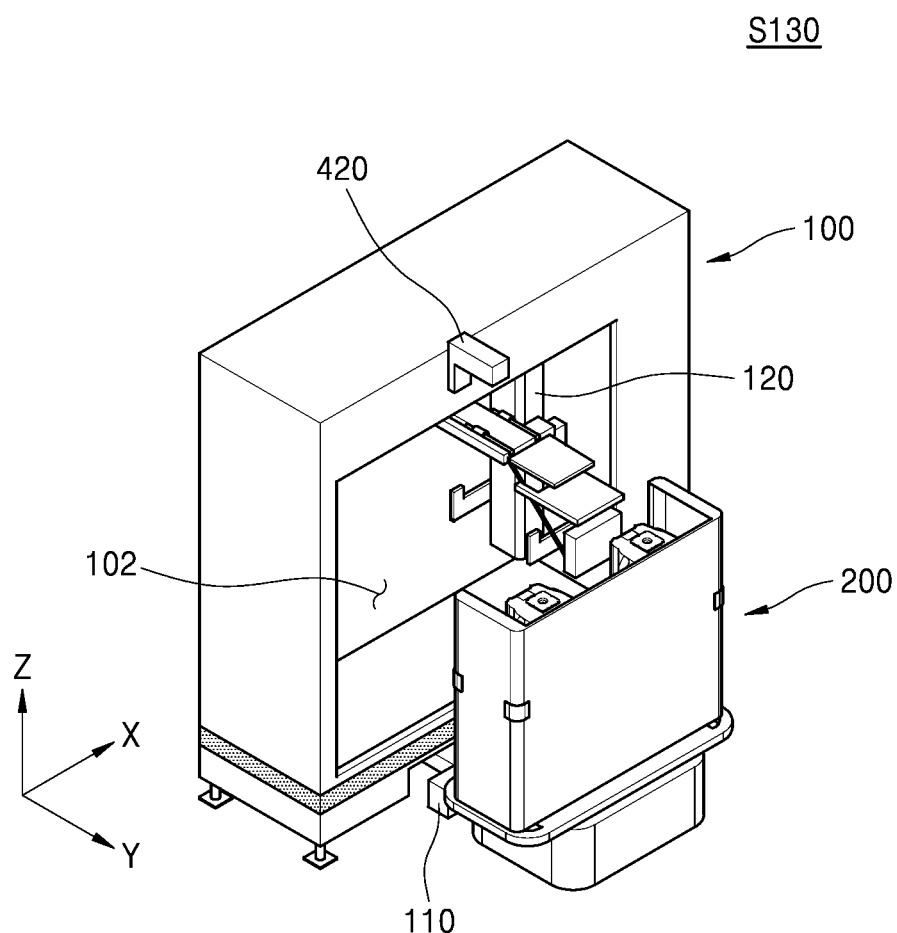
Figure 6:
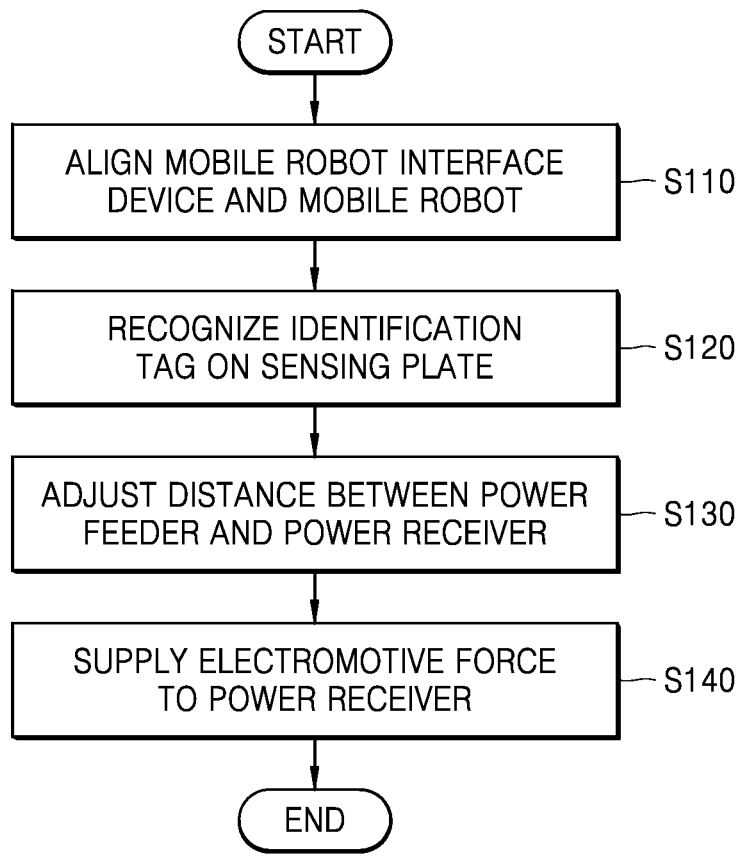
FIG. 6 is a flowchart illustrating the substrate transfer method according to an embodiment of the inventive concept.

FIGS. 5A to 5C are perspective views illustrating a substrate transfer method according to an embodiment of the inventive concept, and FIG. 6 is a flowchart illustrating the substrate transfer method according to an embodiment of the inventive concept.

Referring to FIGS. 1B, 5A, 5B and 6, in order to unload and load the substrate carrier 600 between the mobile robot interface device 100 and the mobile robot 200, the controller 500 may move the mobile robot 200 so that the mobile robot interface device opening portion 102 and the mobile robot opening portion 202 face each other (S110).

Referring to FIGS. 1B, 5B and 6, the tag reader 420 disposed adjacent to a top side of the mobile robot interface device 100 may recognize the plurality of identification tags 410 on the sensing plate 220S (S120), and the controller 500 may control the movement of the mobile robot 200 so that the mobile robot interface device 100 and the mobile robot 200 are aligned. According to an embodiment of the inventive concept, the tag reader 420 may capture the identification tags 410 in a vertical direction (e.g., using an image capture device having a focal plane perpendicular to the vertical direction). For example, the tag reader 420 may be disposed above the sensing plate 220S on which the identification tags 410 are disposed to capture the identification tags 410 downward.

The controller 500 may compare sizes of images of the plurality of identification tags 410 obtained through the tag reader 420 to determine whether the mobile robot interface device 100 and the mobile robot 200 are aligned. When the mobile robot interface device opening portion 102 and the mobile robot opening portion 202 face each other, and the power feeder 110 of the mobile robot interface device 100 and the power receiver 210 of the mobile robot 200 are aligned in a horizontal direction (an X direction and/or a Y direction), the controller 500 may determine that the mobile robot interface device 100 and the mobile robot 200 are aligned.

Referring to FIGS. 1B, 5C, and 6, the controller 500 may control the actuator 300 to adjust the distance between the power feeder 110 and the power receiver 210 (S130). According to an embodiment of the inventive concept, the actuator 300 may move the power feeder 110 in the horizontal direction (e.g., the X direction and/or the Y direction). The actuator 300 may move the power feeder 110 so that a horizontal separation distance between the power feeder 110 and the power receiver 210 is a distance of about 30 mm to about 50 mm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. The range at which actuator 300 moves the power feeder 110 to provide a particular horizontal separation distance between the power feeder 110 and the power receiver 210 may be a range that results in an energy transfer that is above a particular speed, uses below a particular amount of power, and keeps both the power feeder 110 and the power receiver 210 below particular respective temperatures. The resulting range may be described as an optimal range, for example, which optimizes efficiency of charging.

After the power feeder 110 and the power receiver 210 are aligned in the horizontal direction, and the power feeder 110 is moved to a charging position, the power receiver 210 may be supplied with an electromotive force by the power feeder 110. The power receiver 210 may be supplied with the electromotive force using a wireless charging method. The controller 500 may control the power feeder 110 to supply the electromotive force to the power receiver 210 while the substrate carrier 600 is unloaded and loaded between the mobile robot interface device 100 and the mobile robot 200.

Figure 7:
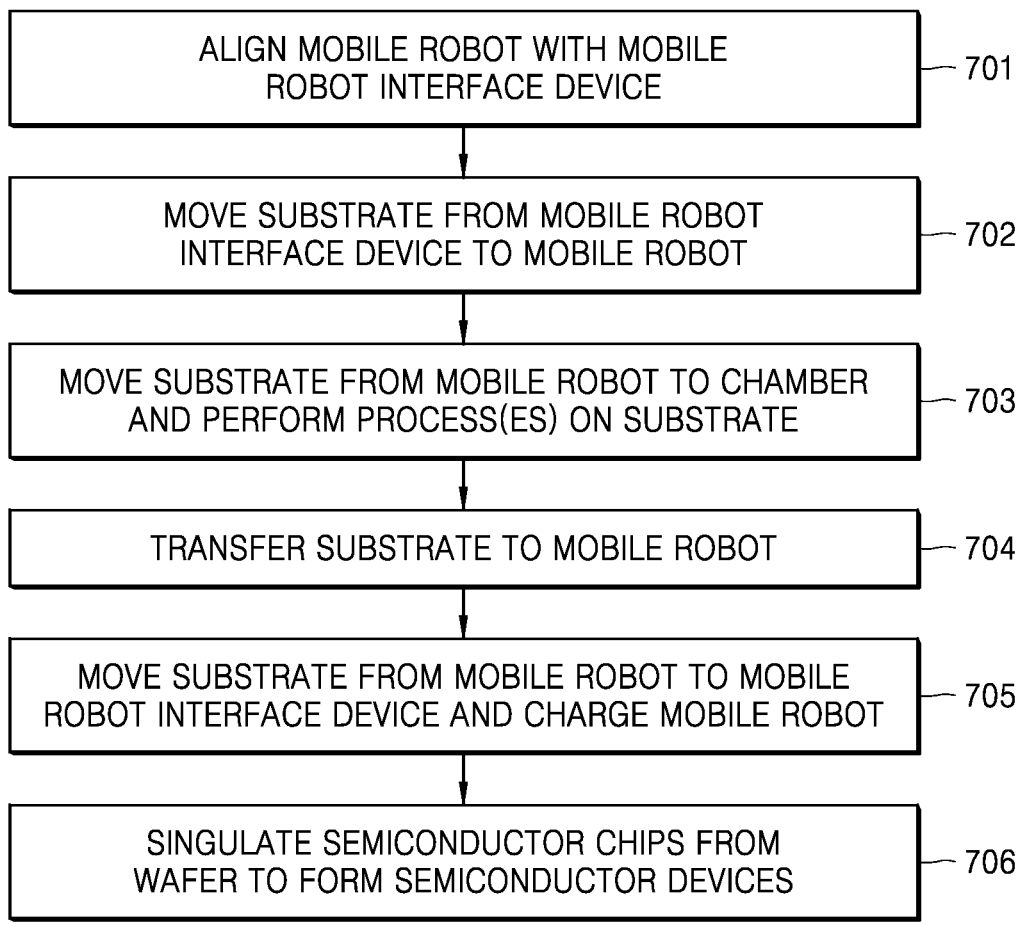
FIG. 7 is a flowchart illustrating a method of manufacturing a semiconductor device according to an embodiment of the inventive concept.

FIG. 7 depicts a method of manufacturing a semiconductor device using a substrate transfer system such as disclosed herein. In step 701, a mobile robot, such as mobile robot 200 aligns with a mobile robot interface device 100. This may be accomplished using the equipment discussed previously. In step 702, a substrate carrier mover, such as a mover arm of a mobile robot interface device, moves at least a first substrate from the mobile robot interface device to the mobile robot. The first substrate, such as a semiconductor wafer, may be previously received by the mobile robot interface device. The first substrate may be transferred to the mobile robot, for example, by transferring a substrate carrier 600 that carries the first substrate. A mover arm, for example, of the mobile robot interface device may be used to implement the transfer. At the same time, during step 702, a battery in the mobile robot wirelessly is charged. For example, the battery may charge by using a power feeder from the mobile robot interface device, as described previously. Also, as described previously, before beginning charging the battery, the power feeder and/or the power receiver may move horizontally, for example toward or away from each other, to adjust a distance between the power feeder and the power receiver. In step 703, the first substrate may be moved to a chamber (not shown) from the mobile robot, where one or more fabrication processes are performed (e.g., layer deposition, etching, doping, packaging, etc.). In step 704, after the one or more fabrication processes are performed, the first substrate, which is a processed substrate, may be transferred back to the mobile robot or to another mobile robot, and then in step 705, the first substrate may be moved from the mobile robot back to the mobile robot interface device or another mobile robot interface device using, for example, the mover arm or a similar mover arm at another mobile robot interface device. At the same time, during step 705, a battery in the mobile robot transferring the processed substrate wirelessly charges. For example, the battery may charge by using a power feeder from the mobile robot interface device with which the mobile robot is aligned, as described previously. A plurality of chambers may be provided, each including a different mobile robot interface device and each performing different processes. A series of fabrication processes may be carried out in the plurality of chambers, resulting in the formation of a semiconductor device, such as a semiconductor chip or semiconductor package. For example, equipment of a first chamber may perform deposition and etching of various layers to form semiconductor memory cells and peripheral circuits on the substrate; equipment of a second chamber may form package terminals, such as solder balls and bumps, on the substrate, and a third chamber may singulate individual semiconductor chips from the substrate, e.g., using a dicing process, to form semiconductor devices such as semiconductor memory chips (step 706).

While the inventive concept has been particularly shown and described with reference to embodiments thereof, it will be understood that various changes in form and details may be made therein without departing from the spirit and scope of the following claims.

It will be understood that, although the terms first, second, third etc. may be used herein to describe various elements, components, regions, and/or sections, these elements, components, regions, and/or sections should not be limited by these terms. Unless the context indicates otherwise, these terms are only used to distinguish one element, component, region, layer or section from another element, component, region, or section, for example as a naming convention. Thus, a first element, component, region, or section discussed below in one section of the specification could be termed a second element, component, region, or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

What is claimed is:

1. A substrate transfer system comprising:
   a mobile robot configured to handle a substrate carrier and comprising a power receiver;
   a mobile robot interface device configured to handle the substrate carrier and comprising a power feeder configured to supply an electromotive force to the power receiver of the mobile robot;
   at least one of: a first actuator configured to move the power feeder to adjust a distance between the power feeder and the power receiver and a second actuator configured to move the power receiver to adjust the distance between the power feeder and the power receiver;
   an identification tag disposed on any one of the mobile robot and the mobile robot interface device;
   a tag reader configured to recognize the identification tag; and
   a controller configured to control an operation of the mobile robot and to control an operation of the first and/or second actuator,
   wherein the controller is configured to control the first and/or second actuator to adjust the distance between the power feeder and the power receiver.

2. The substrate transfer system of claim 1, wherein the power feeder is further configured to supply the electromotive force to the power receiver by using a wireless method.

3. The substrate transfer system of claim 1,
   wherein the mobile robot interface device further comprises a substrate carrier mover configured to transfer the substrate carrier, and
   wherein the controller is configured to control at least one of the first actuator and the second actuator to move at least one of the power receiver and the power feeder and adjust the distance between the power feeder and the power receiver, while the substrate carrier mover transfers the substrate carrier between the mobile robot interface device and the mobile robot.

4. The substrate transfer system of claim 1, wherein the controller is further configured to measure a horizontal separation distance between the mobile robot interface device and the mobile robot by using at least one of a size of an image of the identification tag captured by the tag reader and a position of the image of the identification tag.

5. The substrate transfer system of claim 1, wherein a plurality of identification tags are disposed on any one of the mobile robot and the mobile robot interface device.

6. The substrate transfer system of claim 1, wherein the controller is further configured to control the mobile robot so that the power receiver and the power feeder face each other.

7. The substrate transfer system of claim 1, wherein when the substrate transfer system comprises the first actuator, the first actuator is configured to move the power feeder in a horizontal direction, and when the substrate transfer system comprises the second actuator, the second actuator is configured to move the power receiver in the horizontal direction.

8. A substrate transfer system comprising:
   a mobile robot configured to handle a substrate carrier and comprising a power receiver;
   a mobile robot interface device configured to handle the substrate carrier and comprising a power feeder configured to supply an electromotive force to the power receiver of the mobile robot;
   at least one of: a first actuator configured to move the power feeder to adjust a distance between the power feeder and the power receiver, and a second actuator configured to move the power receiver to adjust the distance between the power feeder and the power receiver;
   one or more identification tags disposed on any one of the mobile robot and the mobile robot interface device;
   a tag reader configured to recognize the one or more identification tags; and
   a controller configured to control an operation of each of the mobile robot and the first actuator and/or the second actuator,
   wherein the controller is further configured to control at least one of the first actuator and the second actuator to adjust the distance between the power feeder and the power receiver,
   wherein the controller is further configured to control the mobile robot to align the mobile robot interface device and the mobile robot, and
   wherein the power feeder is further configured to supply the electromotive force to the power receiver by using a wireless method.

9. The substrate transfer system of claim 8,
   wherein the mobile robot further comprises a sensing plate configured on which to load the substrate carrier, and
   wherein the one or more identification tags are disposed on the sensing plate.

10. The substrate transfer system of claim 8, wherein an alignment direction of the power receiver and the power feeder and a capture direction of the tag reader are perpendicular to each other.

11. The substrate transfer system of claim 8, wherein the tag reader is configured to recognize the one or more identification tags, and the controller is further configured to measure a horizontal separation distance between the mobile robot interface device and the mobile robot based on capture information of the tag reader.

12. The substrate transfer system of claim 8,
wherein a plurality of identification tags are disposed, and
wherein the controller is further configured to measure a horizontal separation distance between the mobile robot interface device and the mobile robot and a posture of the mobile robot, by using at least one of sizes of images of the plurality of identification tags and relative positions of the images of the plurality of identification tags.

13. The substrate transfer system of claim 8, wherein the controller is further configured to control the first actuator and/or second actuator to adjust the distance between the power feeder and the power receiver while a battery of the mobile robot is being charged.

14. The substrate transfer system of claim 8, wherein the controller is further configured to control the first actuator and/or the second actuator based on at least one of a charging voltage, a charging current and a temperature of the power feeder, a charging voltage, a charging current and a temperature of a battery of the mobile robot, and an operation of a substrate carrier mover of the mobile robot interface device, to control a horizontal separation distance between the power feeder and the power receiver.

15. A substrate transfer system comprising:
a mobile robot configured to handle a substrate carrier and comprising a power receiver;
a mobile robot interface device configured to handle the substrate carrier and comprising a power feeder configured to supply an electromotive force to the power receiver of the mobile robot;
an actuator system configured to move at least one of the power feeder and the power receiver to adjust a distance between the power feeder and the power receiver;
a plurality of identification tags disposed on any one of the mobile robot and the mobile robot interface device;
a tag reader configured to recognize the plurality of identification tags; and
a controller configured to control an operation of each of the mobile robot and the actuator system,
wherein the controller is further configured to control the actuator system to adjust the distance between the power feeder and the power receiver,
wherein the power feeder is configured to supply the electromotive force to the power receiver by using a wireless method,
wherein the controller is further configured to measure a horizontal separation distance between the mobile robot interface device and the mobile robot and a posture of the mobile robot, by using sizes of images of the plurality of identification tags and the relative positions of the images of the plurality of identification tags, and
wherein the controller is further configured to control the mobile robot so that the mobile robot interface device and the mobile robot are aligned.

16. The substrate transfer system of claim 15, wherein while the electromotive force is supplied to the power receiver by the power feeder, a position of the mobile robot is fixed.

17. The substrate transfer system of claim 15, wherein when the actuator system moves the power feeder, the power feeder is movable in a horizontal direction, and the power feeder is further configured such that after a position of the mobile robot is fixed, the power feeder moves in the horizontal direction and supplies the electromotive force to the power receiver.

18. The substrate transfer system of claim 15, wherein the tag reader is disposed adjacent to a top side of the mobile robot interface device, and the plurality of identification tags are disposed adjacent to a top side of the mobile robot.

19. The substrate transfer system of claim 15, further comprising a distance measuring sensor configured to measure the distance between the power feeder and the power receiver.

20. The substrate transfer system of claim 15, wherein the controller is further configured to control the actuator system to control a range of the distance between the power feeder and the power receiver to about 30 mm to about 50 mm.

* * * * *